(12) United States Patent
Lin et al.

(10) Patent No.: US 8,644,591 B2
(45) Date of Patent: Feb. 4, 2014

(54) ALIGNMENT METHOD FOR ASSEMBLING SUBSTRATES WITHOUT FIDUCIAL MARK

(75) Inventors: Chorng-tyan Lin, Kaohsiung (TW); Chih-chin Wen, Kaohsiung (TW); Chun-ming Yang, Kaohsiung (TW); Jwu-jiun Yang, Kaohsiung (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 51 days.

(21) Appl. No.: 13/352,323

(22) Filed: Jan. 17, 2012

(65) Prior Publication Data
US 2013/0148878 A1 Jun. 13, 2013

(30) Foreign Application Priority Data
Dec. 8, 2011 (TW) .............................. 100145345 A (51) Int. Cl.
*G06K 9/00* (2006.01)
(52) U.S. Cl.
USPC .......................................... 382/151; 382/152
(58) Field of Classification Search
None
See application file for complete search history.

(56) References Cited

U.S. PATENT DOCUMENTS

| | | | | |
|---|---|---|---|---|
| 5,859,923 A * | 1/1999 | Petry et al. | ..................... | 382/141 |
| 5,960,125 A * | 9/1999 | Michael et al. | ................ | 382/294 |
| 6,301,396 B1 * | 10/2001 | Michael et al. | ................ | 382/294 |
| 6,751,361 B1 * | 6/2004 | Wagman | ....................... | 382/287 |
| 6,993,177 B1 * | 1/2006 | Bachelder | ..................... | 382/151 |
| 7,734,084 B2 * | 6/2010 | Stewart et al. | ................ | 382/151 |
| 7,813,559 B2 * | 10/2010 | Duquette et al. | ............... | 382/219 |
| 8,094,925 B2 * | 1/2012 | Schneidewind et al. | ...... | 382/151 |
| 2008/0050006 A1 * | 2/2008 | Michael et al. | ............... | 382/144 |
| 2008/0112609 A1 * | 5/2008 | Inoue | ............................. | 382/151 |
| 2013/0077856 A1 * | 3/2013 | Ferro | ............................ | 382/159 |

FOREIGN PATENT DOCUMENTS

TW    I288365    * 10/2007 ............... G06T 5/00

\* cited by examiner

*Primary Examiner* — Vu Le
*Assistant Examiner* — Alexander J Lesnick
(74) *Attorney, Agent, or Firm* — Cheng-Ju Chiang (57) ABSTRACT

An alignment method for assembling substrates without fiducial mark is provided and has steps of: pre-defining at least two partially standard character regions; capturing at least two partially actual images of a first substrate; comparing to obtain at least two partially actual character regions; building an actual coordinate system of the first substrate; comparing the actual coordinate system with a coordinate system of a second substrate to obtain three types of offset values; moving the first substrate to a correct waiting position based on the offset values; ensuring if the first substrate is disposed at the correct waiting position; and stacking the first substrate with the second substrate to finish the alignment and installation. Thus, the alignment method of the present invention can be applied to to-be-installed substrates without any fiducial mark for alignment.

9 Claims, 5 Drawing Sheets

ALIGNMENT METHOD FOR ASSEMBLING SUBSTRATES WITHOUT FIDUCIAL MARK

BACKGROUND OF THE INVENTION

1. Field of Invention

The present invention relates to an alignment method for assembling substrates without fiducial mark and more particularly to an alignment method for assembling substrates which employs characters of surface shapes of substrates as referenced fiducial marks to calculate movement compensation values of the substrates without other fiducial mark.

2. Related Art

In the technological fields of liquid crystal display, semiconductor chip and printed circuit board (PCB), precise stacking and alignment for the assembling of a plurality of substrates are demanded, so that various alignment apparatuses and special fiducial marks are developed by manufacturers in order to align and assemble substrates more precisely and speedily.

Figure 1:
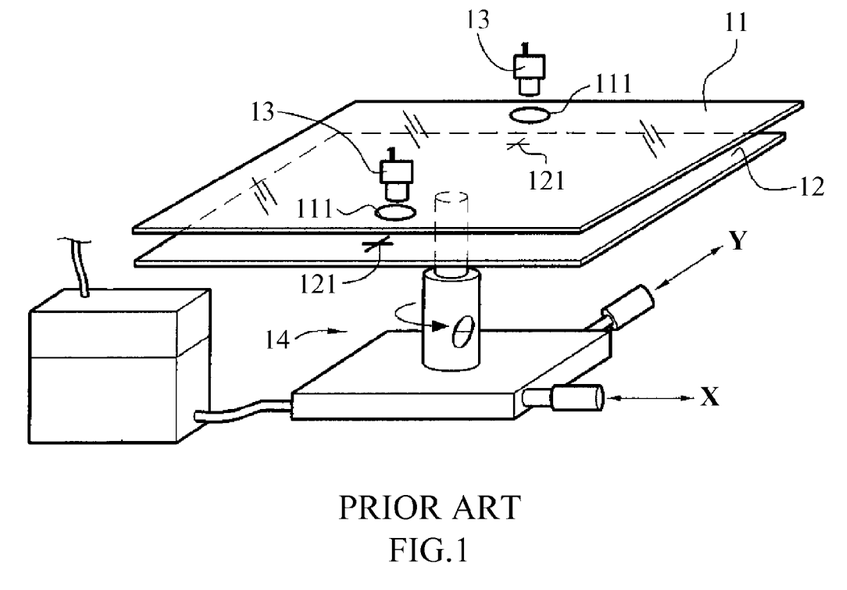
FIG. 1 is an illustration of existing dual plates and alignment fiducial marks thereof.

Refer to FIG. 1 for an example, the Taiwanese Patent No. I288365 applied by the applicant of the present invention discloses an alignment fiducial marks design for an alignment and movement control system of dual plates and its image processing method, an existing alignment and movement control method of dual plates is provided for precise alignment of a first plate and a second plate, it mainly includes following steps of:

In a step (S1): providing two sets of alignment fiducial marks 111 and 121 disposed at same positions on two opposite sides on a first plate 11 and a second plate 12, respectively;

In a step (S2): obtaining two sets of composite images of the alignment fiducial marks 111 and 121 by two image capturing devices 13 disposed at two opposite sides of the first plate 11 or the second plate 12;

In a step (S3): calculating offset values of two sets of coordinates of the composite images by an image processing method to obtain the offset values ($\Delta X1$, $\Delta Y1$), ($\Delta X2$, $\Delta Y2$) of the two coordinate sets;

In a step (S4): obtaining offset values $\Delta X1$, $\Delta Y1$ of positions and an offset value $\Delta\theta$ of angle between the first plate 11 and the second plate 12 by calculating the offset values of the two coordinate sets; and In a step (S5): compensating the offset values of positions and the offset value of angle by a tri-axial movement control module 14.

The alignment and movement control method of dual plates employs the circular alignment holes as well as cross, circular or rectangular alignment fiducial marks as the alignment fiducial marks 111 and 121 between the first plate 11 and the second plate 12. Even though the precise alignment of the dual plates can be done automatically and speedily, the alignment process may not be able to be finished smoothly because of the overlapping of images; and the alignment holes and alignment fiducial marks have to be pre-designed on the two substrates separately, which will increase the work procedures and costs.

Therefore, an improved alignment method for assembling substrates is required to solve the existing problems of the conventional techniques.

SUMMARY OF THE INVENTION

A primary object of the present invention is to provide an alignment method for assembling substrates without fiducial mark, by employing existing characters of surface shapes of partially specific regions of the substrates as referenced fiducial marks to replace the existing alignment holes and fiducial marks, the movement compensation values required for the assembling of the to-be-installed substrates can be calculated without any fiducial mark specifically designed for alignment, so that the costs of alignment for assembling can be reduced and the alignment precision can be enhanced.

A secondary object of the present invention is to provide an alignment method for assembling substrates without fiducial mark, by employing existing characters of surface shapes of partially specific regions of the substrates as referenced fiducial marks, specific regions on the substrates are not required to be reserved for disposing alignment holes and fiducial marks, so that the spaces on surfaces of the substrates will not be occupied and the dimensions of the substrates will not be affected, also the appearances of the substrates will not be affected and the designing for the substrates can be simplified.

Another object of the present invention is to provide an alignment method for assembling substrates without fiducial mark, when alignment and assembling are processed for substrates of different specifications by machines, existing characters of a surface shape of a particular partial region of the substrate can be set and changed as referenced fiducial marks by an image processing device based on the different specifications of the substrate, so that a flexibility of operational settings for the alignment and assembling of the substrates can be enhanced.

To achieve the above object, the present invention provides an alignment method for assembling substrates without fiducial mark, and the alignment method comprising steps of:

a step (S01) of pre-capturing at least two partially standard images (i.e. regional template images) of a first substrate i.e. a template substrate without fiducial mark), and pre-defining a partially standard character region (i.e. template surface shape feature) in each of the partially standard images and storing character data of shapes of the partially standard character region before assembling;

a step (S02) of disposing another to-be-aligned first substrate which is the same as the template substrate without fiducial mark in a alignment-and-assembling space, and capturing at least two partially actual images (i.e. regional run-time images) of the first substrate when assembling;

a step (S03) of comparing the partially actual images of the first substrate with the character data of shapes of the partially standard character regions to obtain at least two partially actual character regions (i.e. run-time surface shape features) in the partially actual images matching with the partially standard character regions;

a step (S04) of building an actual coordinate system of the first substrate by using center coordinates of the at least two partially actual character regions;

a step (S05) of comparing the actual coordinate system of the first substrate with a coordinate system of a second substrate without fiducial mark to obtain three types of offset values $\Delta X$, $\Delta Y$, $\Delta\theta$ of the first substrate on the X and Y axial directions and the rotational angle relative to the correct waiting position of the alignment-and-assembling space; and a step (S06) of using the offset values $\Delta X$, $\Delta Y$, $\Delta\theta$ as movement compensation values of the first substrate to move the first substrate to the correct waiting position in the alignment-and-assembling space if the offset values $\Delta X$, $\Delta Y$, $\Delta\theta$ are larger than a preset value; and determining that the first substrate is at the correct waiting position in the alignment-and-assembling space if the offset values $\Delta X$, $\Delta Y$, $\Delta\theta$ are smaller than the preset value.

In one embodiment of the present invention, after the step (S06), further comprising:

- a step (S07) of processing the steps (S02) to (S06) again to ensure if the first substrate is at the correct waiting position in the alignment-and-assembling space, if yes, then proceeding to a step (S08); if not, then going back to the step (S02); and
- a step (S08) of moving the first substrate by a predetermined movement value $\Delta Z$ along the Z axis until the first substrate is aligned with the second substrate in the alignment-and-assembling space to finish with alignment and assembling.

In one embodiment of the present invention, after the step (S06), the step (S07) can be selectively omitted, and the step (S08) is directly performed.

In one embodiment of the present invention, the capturing of the partially standard images of the first substrate in the step (S01) is performed by at least one first image capturing unit of CCD or CMOS type.

In one embodiment of the present invention, the capturing of the partially actual images of the first substrate in the step (S02) is performed by the same first image capturing unit of CCD or CMOS type.

In one embodiment of the present invention, the center coordinates of a central position of each of the partially actual character regions in the step (S04) are obtained by computing with a centroid method in order to build the actual coordinate system of the first substrate.

In one embodiment of the present invention, the capturing of the at least two partially actual images (i.e. regional runtime images) of the second substrate in the step (S05) is performed by at least one second image capturing unit different from the first image capturing unit, then obtaining center coordinates of a central position of each of the partially actual images of the second substrate with centroid method in order to build the coordinate system of the second substrate.

In one embodiment of the present invention, the second substrate in the alignment-and-assembling space in the step (S06) is disposed below or above the first substrate in the alignment-and-assembling space along the Z axis.

In one embodiment of the present invention, a tri-axial movement device is used to move the first substrate along the X, Y and $\theta$ axes in the step (S06).

In one embodiment of the present invention, the tri-axial movement device is used to further move the first substrate along the Z axis.

In one embodiment of the present invention, the first and the second substrates are selected from: two single layered circuit substrates of a multi-layered printed circuit board, two glass substrates of a liquid crystal panel module, an outer frame of a display and a liquid crystal panel module, a glass photomask and a wafer, a chemical test paper and a protective film. The types or positions of the first and the second substrates also can be interchanged.

The structure and the technical means adopted by the present invention to achieve the above and other objects can be best understood by referring to the following detailed description of the preferred embodiments and the accompanying drawings.

DETAILED DESCRIPTION OF THE INVENTION

The structure and the technical means adopted by the present invention to achieve the above and other objects can be best understood by referring to the following detailed description of the preferred embodiments and the accompanying drawings. Moreover, the following terms mentioned in the present invention, for instances, upper, lower, front, rear, left, right, inside, outside, lateral side, etc, are for directions in connection with the figures attached. Therefore, these direction terms are used to explain and help to comprehend the present invention, but not as limitations thereof.

The present invention provides an alignment method for assembling substrates without fiducial mark, by employing existing characters of surface shapes of partially specific regions of the substrates as referenced fiducial marks to replace the existing alignment holes and cross, circular or rectangular alignment fiducial marks, fiducial marks are thus not required to be specifically designed for the alignment of the to-be-installed substrates, so that the present invention is limited to be applied to substrates without fiducial marks. If fiducial marks are included on the to-be-installed substrates specifically designed for alignment and assembling of dual or multi-plates, then they are not included in the application range of the method of the present invention.

Figure 2:
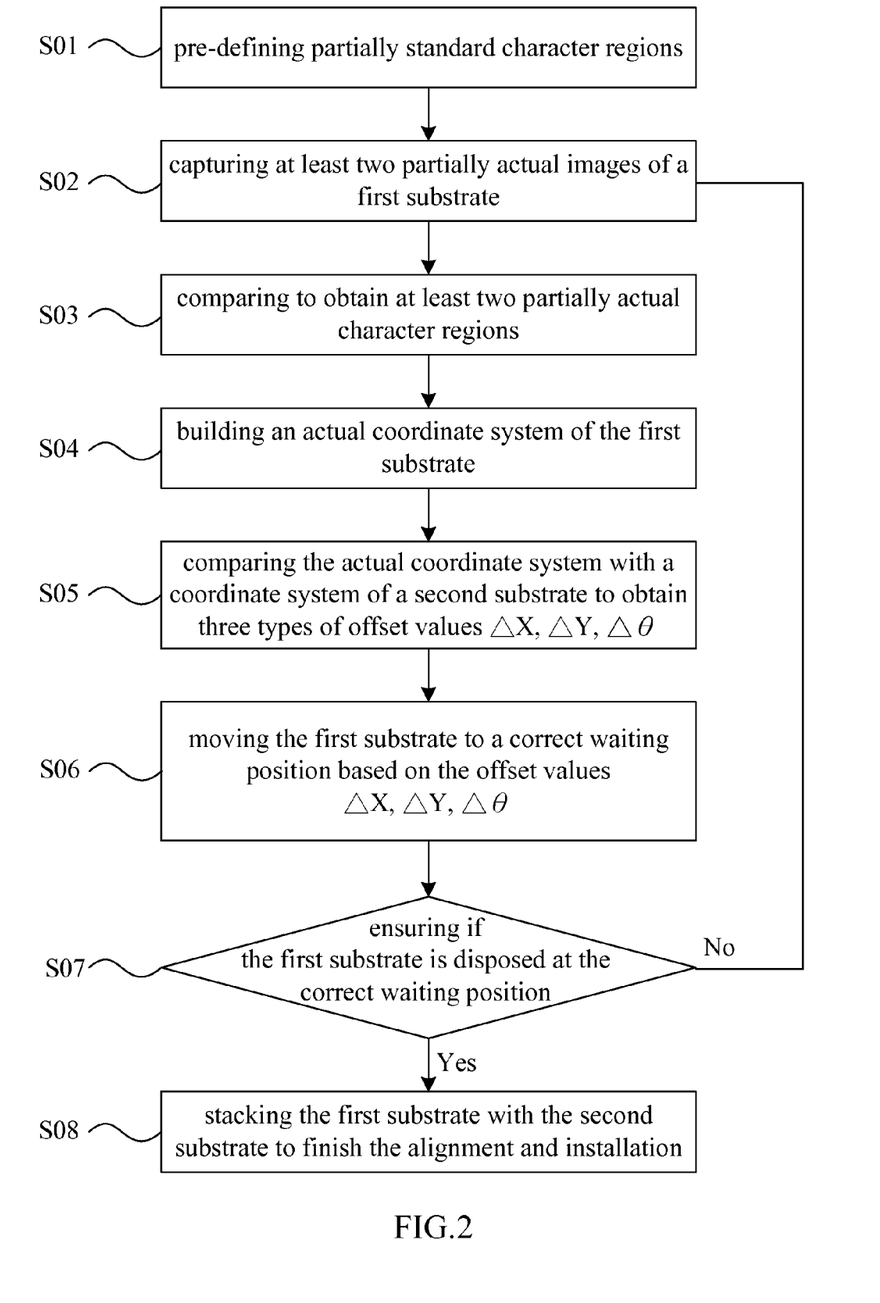
FIG. 2 is a block diagram of a flow chart of an alignment method for assembling substrates without fiducial mark according to a preferred embodiment of the present invention.

Referring to FIG. 2, the alignment method for assembling substrates without fiducial mark of a preferred embodiment of the present invention mainly includes following steps of: (S01): pre-defining partially standard character regions; (S02): capturing at least two partially actual images of a first substrate; (S03): comparing to obtain at least two partially actual character regions; (S04): building an actual coordinate system of the first substrate; (S05): comparing the actual coordinate system with a coordinate system of a second substrate to obtain three types of offset values $\Delta X$, $\Delta Y$, $\Delta\theta$; (S06): moving the first substrate to a correct waiting position based on the offset values $\Delta X$, $\Delta Y$, $\Delta\theta$; (S07): ensuring if the first substrate is disposed at the correct waiting position; and (S08): stacking the first substrate with the second substrate to finish the alignment and installation. Embodied details and principles of the abovementioned steps of the preferred embodiment of the present invention will be described below using FIGS. 2 to 6.

Figure 3:
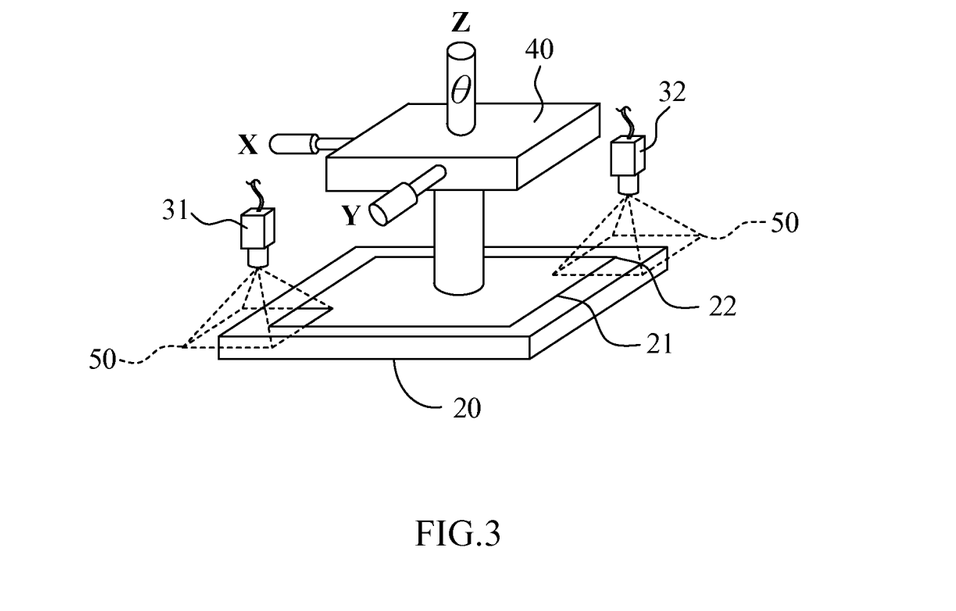
FIGS. 3 and 3A are a perspective view and a partially enlarged view of pre-defining partially standard character regions in a step (S01) according to the preferred embodiment of the present invention.
Figure 3A:
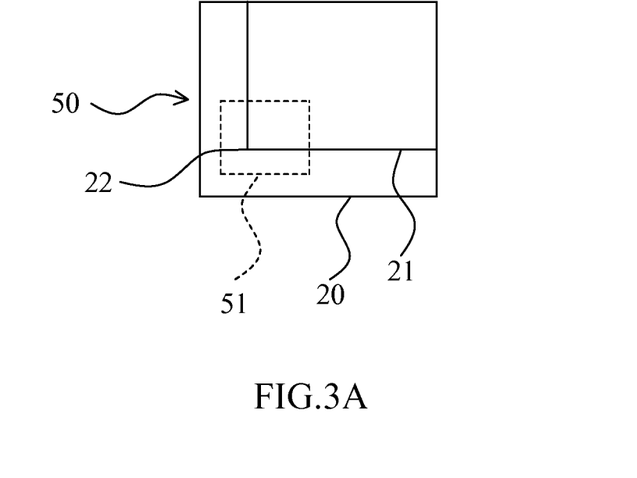

Referring to FIGS. 2, 3 and 3A, details of the step (S01) of the alignment method for assembling substrates without fiducial mark of the preferred embodiment of the present invention are: before assembling, pre-capturing at least two partially standard images 50 of a first substrate 20, and pre-defining a partially standard character region 51 in each of the partially standard images 50 and storing their character data of shapes. In the step, the first substrate 20 is first fixed in a alignment-and-assembling space 100 (not but limited to be fixed in the space 100) by using a set of tri-axial movement device 40 by methods of vacuum sucking disc or clamping claws, the first substrate 20 can be selected from: a single layered circuit substrate of a multi-layered printed circuit board, a glass substrate of a liquid crystal panel module, an outer frame of a display or a liquid crystal panel module, a glass photomask or a wafer, a chemical test paper or a protective film, but it is not limited to them. In the embodiment, an outer frame of a display is used as the first substrate 20, it comprises an outer metal frame and a glass protective cover, the outer metal frame includes an inner edge 21 which has a plurality of inner edge corners 22.

Referring to FIGS. 3 and 3A, in the embodiment, the partially standard images 50 of the first substrate 20 can be captured by at least one image capturing unit of charge-coupled device (CCD) or complementary metal oxide semiconductor (CMOS) type, for example, two sets of CCD type image capturing units 31 and 32 are disposed diagonally or at two ends of a same side of the first substrate 20 above the two inner edge corners 22 to capture the partially standard images 50 of the first substrate 20. Then, the partially standard images 50 are sent to an image processing device (not illustrated in the drawings, e.g. a computer) at a near end or remote end, and the partially standard character region 51 (e.g. a regional image including the inner edge corner 22) can be pre-defined in each of the partially standard images 50 by the image processing device, and the character data of shapes of the partially standard character regions 51 are stored. The step (S01) needs to be finished before starting the assembling, its purpose is to have the character data of shapes of the partially standard character regions 51 stored as referenced standards for comparing images when the assembling is started in the step (S02).

Figure 4:
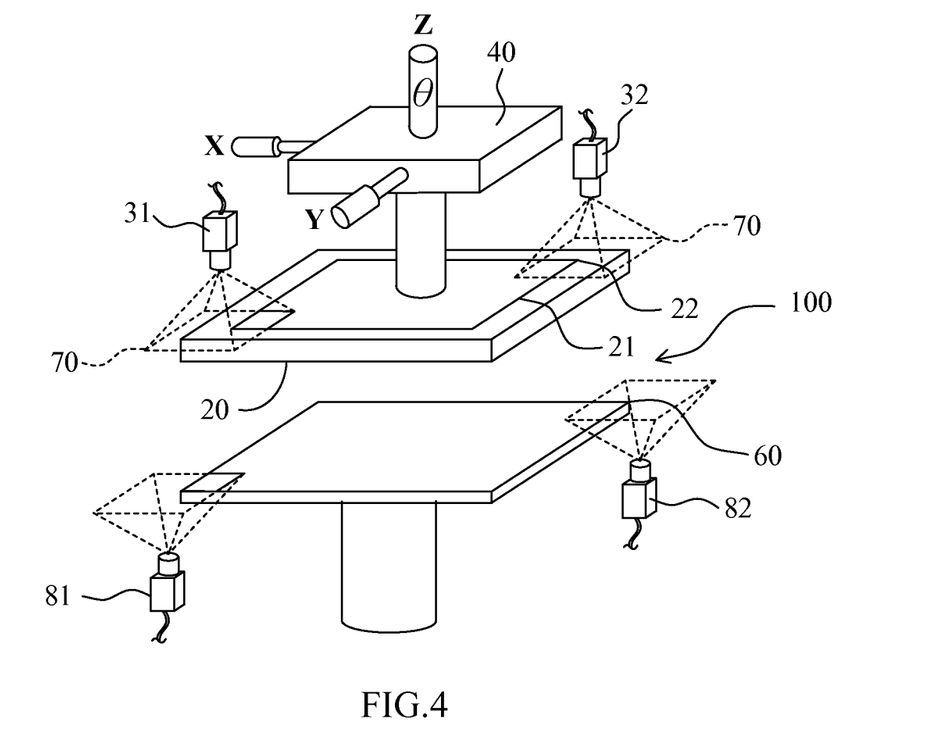
FIG. 4 is a perspective view of capturing at least two partially actual images of a first substrate in a step (S02) according to the preferred embodiment of the present invention.
Figure 4A:
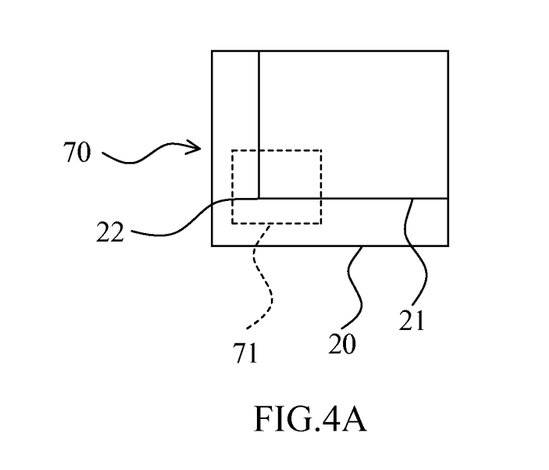
FIG. 4A is a partially enlarged view of comparing to obtain at least two partially actual character regions in a step (S03) according to the preferred embodiment of the present invention.

Referring to FIGS. 2, 4 and 4A, details of the step (S02) of the alignment method for assembling substrates without fiducial mark of the preferred embodiment of the present invention are: before the assembling, disposing the other first substrate 20 to be aligned in the alignment-and-assembling space 100, and capturing at least two partially actual images 70 of the first substrate 20. In the step of the embodiment, the first to-be-aligned substrate 20 is placed in the alignment-and-assembling space 100, and the first substrate 20 is located almost at the correct waiting position by the placing action while there are inevitably offset values on the X and Y axes and a rotational angle (i.e. θ axis). At the same time, placing a second substrate 60 to be aligned above or below the first substrate 20 along the Z axial direction thereof. Then, capturing the partially actual images 70 of the first substrate 20 by the same image capturing unit of CCD or CMOS type in this embodiment, for example, when the assembling is being processed, two sets of the CCD type image capturing units 31 and 32 used in the step (S01) are used to captured the at least two partially actual images 70 of the first to-be-aligned substrate 20. The second substrate 60 can be selected from: a single layered circuit substrate of a multi-layered printed circuit board, a glass substrate of a liquid crystal panel module, a liquid crystal panel module or an outer frame of a display, a wafer or a glass photomask, a protective film or a chemical test paper, but it is not limited to them. In the embodiment, a liquid crystal panel module is used as the second substrate 60, and the second substrate 60 and the first substrate 20 (an outer frame of a display) are assembled together to form a semi-finished product of liquid crystal display.

Referring to FIGS. 2, 4 and 4A, details of the step (S03) of the alignment method for assembling substrates without fiducial mark of the preferred embodiment of the present invention are: comparing the partially actual images 70 of the first substrate 20 with the character data of shapes of the partially standard character regions 51 to obtain at least two partially actual character regions 71 in the partially actual images 70 matching with the partially standard character regions 51. In the step, the partially actual images 70 are sent to the same image processing device (e.g. a computer), and each of the partially actual images 70 is compared with the character data of shapes of the partially standard character regions 51 by the image processing device respectively, in order to obtain the at least two partially actual character regions 71 in the partially actual images 70 matching with the partially standard character regions 51, and the character data of shapes of the partially actual character regions 71 are stored.

Referring to FIGS. 2 and 4, details of the step (S04) of the alignment method for assembling substrates without fiducial mark of the preferred embodiment of the present invention are: building an actual coordinate system of the first substrate 20 by using center coordinates of the at least two partially actual character regions 71. In the step of the embodiment, computing with centroid (geometrical center) method by the same image processing device (e.g. a computer) to obtain the center coordinates of a geometrical central position of each of the partially actual character regions 71 in order to build the actual coordinate system of the first substrate 20. For example, computing with centroid method by a computer to obtain center coordinates (X1,Y1) of a geometrical central position of a first partially actual character region 71 and center coordinates (X2,Y2) of a geometrical central position of a second partially actual character region 71, and so on. When defining the center coordinates of each of the partially actual character regions 71, known coordinate values of pre-determined regions of the at least two image capturing units 31 and 32 can be used as referenced standards to define center coordinate values of each of the partially actual character regions 71. Lastly, the actual coordinate system of the first substrate 20 can be built by the image processing device using at least the two sets of center coordinates (X1,Y1) and (X2, Y2).

Referring to FIGS. 2 and 4, details of the step (S05) of the alignment method for assembling substrates without fiducial mark of the preferred embodiment of the present invention are: comparing the actual coordinate system of the first substrate 20 with a coordinate system of a second substrate to obtain three types of offset values ΔX, ΔY, Δθ of the first substrate 20 on the X and Y axial directions and the rotational angle relative to the correct waiting position of the alignment-and-assembling space 100. In the step, the coordinate system of the second substrate can be obtained by: before or in the step (S05), capturing at least two partially actual images of the second substrate 60 by at least one image capturing unit of CCD or CMOS type (e.g. two sets of image capturing units 81 and 82), then obtaining center coordinates of a central position of each of the partially actual images of the second substrate 60 with centroid method to build the coordinate system of the second substrate. Then, values of the coordinate system of the second substrate on the X, Y axial directions and the rotational angle (i.e. θ axis) can be used in this step in order to be compared with the actual coordinate system of the first substrate 20 obtained from the last step. After the comparison, the three types of offset values ΔX, ΔY, Δθ of the first substrate 20 on the X and Y axial directions and the rotational angle relative to the correct waiting position of the alignment-and-assembling space 100 can be obtained.

Figure 5:
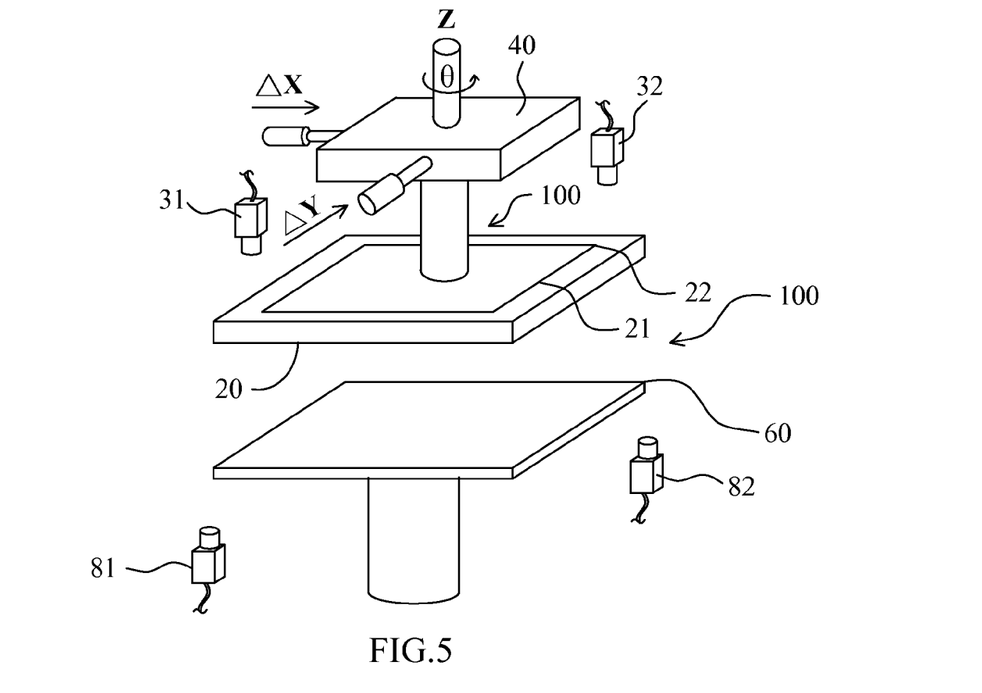
FIG. 5 is a perspective view of moving the first substrate to a correct waiting position based on offset values $\Delta X$, $\Delta Y$, $\Delta\theta$ in a step (S06) according to the preferred embodiment of the present invention.
Figure 6:
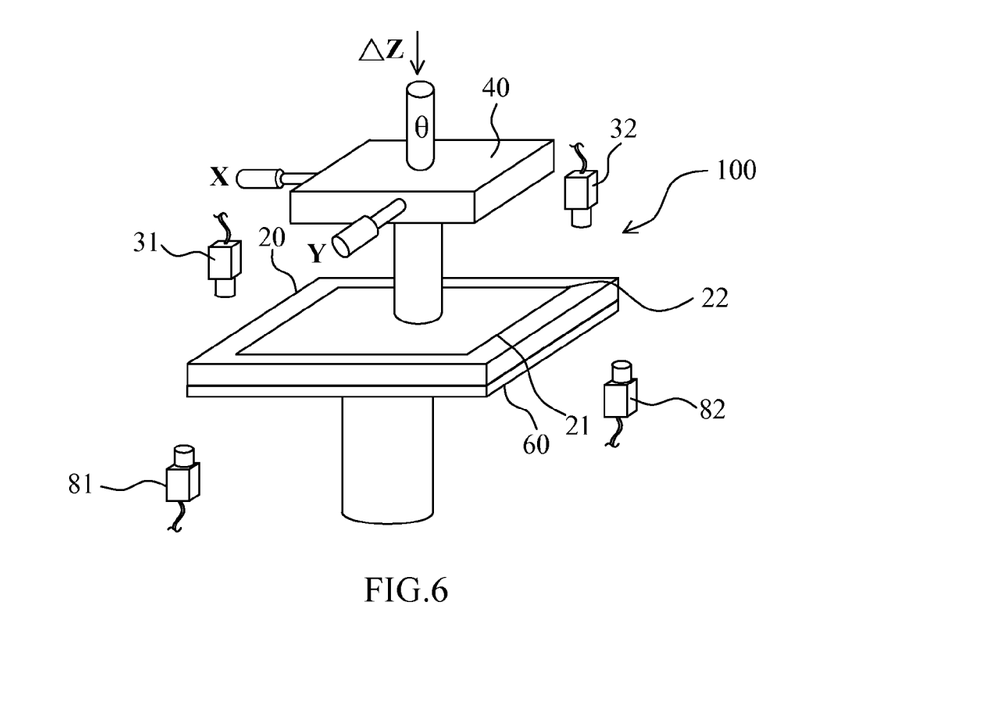
FIG. 6 is a perspective view of stacking the first substrate with a second substrate to finish the alignment and installation in a step (S08) according to the preferred embodiment of the present invention.

Referring to FIGS. 2, 5 and 6, details of the step (S06) of the alignment method for assembling substrates without fiducial mark of the preferred embodiment of the present invention are: if the offset values ΔX, ΔY, Δθ are larger than a preset value, then using the offset values ΔX, ΔY, Δθ as the movement compensation values of the first substrate 20 to move the first substrate 20 to the correct waiting position in the alignment-and-assembling space 100; or if the offset values ΔX, ΔY, Δθ are smaller than the preset value, then determining that the first substrate 20 is at the correct waiting position in the alignment-and-assembling space 100. In the step of this embodiment, a preset value (threshold value) is pre-stored in the image processing device, if the offset values ΔX, ΔY, Δθ are found to be larger than the preset value after comparing by the image processing device, it indicates that the position of the first substrate 20 has to be calibrated, and the first substrate 20 is moved by the tri-axial movement device 40 along the X. Y and θ axes, so that the first substrate 20 can meet the offset values ΔX, ΔY, Δθ by moving it in the alignment-and-assembling space 100, thereby the first substrate 20 should be able to reach the correct waiting position in the alignment-and-assembling space 100. On the other hand, if the offset values ΔX, ΔY, Δθ are smaller than the preset value, it indicates that the position of the first substrate 20 does not need to be calibrated, so that it can be determined that the first substrate 20 is at the correct waiting position in the alignment-and-assembling space 100, and the first substrate 20 does not have to be moved by the tri-axial movement device 40.

Referring to FIG. 2, following steps are further included after the step (S06) in the present invention in order to ensure the correctness of processing of the step (S06):

(S07): processing the steps (S02) to (S06) again to ensure if the first substrate 20 is at the correct waiting position in the alignment-and-assembling space 100, if yes, then proceeding to step (S08); if not, then going back to the step (S02); and (S08): moving the first substrate 20 by a predetermined movement value ΔZ along the Z axis until it is aligned with the second substrate 60 in the alignment-and-assembling space 100 to finish with the assembling.

In the step (S07), if the ensuring action can be commanded by the image processing device, then this ensuring action can be, for examples: capturing the at least two partially actual images 70 of the first substrate 20 which has finished with the step (S06) by the image capturing units 31 and 32 as performed in the step (S02), and performing the actions similar to the steps (S03), (S04) and (S05), if the offset values ΔX, ΔY, Δθ of the first substrate 20 obtained from the second time are smaller than the preset value, it indicates that the position of the first substrate 20 does not need to be calibrated, so that it can be determined that the first substrate 20 is at the correct waiting position in the alignment-and-assembling space 100. If the offset values ΔX, ΔY, Δθ of the first substrate 20 obtained from the second time are larger than the preset value, then moving the first substrate 20 by the tri-axial movement device 40 along the X. Y and θ axes, so that the first substrate 20 can meet the offset values ΔX, ΔY, Δθ obtained from the second time by moving it in the alignment-and-assembling space 100, thereby the first substrate 20 should be able to reach the correct waiting position in the alignment-and-assembling space 100. Then, in the step (S08), moving the first substrate 20 by the tri-axial movement device 40 by a predetermined movement value ΔZ along the Z axis (e.g. moving by a predetermined distance downward) until it is aligned and stacked with the second substrate 60 in the alignment-and-assembling space 100 to finish with the assembling. It should be noted that, the step (S07) can be repeated two times or more for the sake of correctness, but if an efficiency of inspection and testing is demanded, then the step (S07) can be omitted and proceeding to the step (S08) directly.

As a conclusion from the abovementioned, comparing with the drawbacks of employing the circular alignment holes as well as cross, circular or rectangular alignment fiducial marks as the alignment marks between the dual plates by the existing alignment and movement control method of dual plates, the present invention in FIGS. 2 to 6 employs the existing characters of surface shapes of the partially specific regions of the substrates as the referenced fiducial marks (e.g. the partially actual character regions 71 of the inner edge corners 22) to replace the existing alignment holes and fiducial marks, so that the movement compensation values required for the assembling of the to-be-installed substrates can be calculated without any fiducial mark specifically designed for alignment, so that the costs of alignment for assembling can be reduced and the alignment precision can be enhanced.

Furthermore, by employing the existing characters of surface shapes of the partially specific regions of the substrates as the referenced fiducial marks (e.g. the partially actual character regions 71 of the inner edge corners 22) in the present invention, specific regions on the substrates are not required to be reserved for disposing of alignment holes and fiducial marks, so that the spaces on the surfaces of the substrates will not be occupied and the dimensions of the substrates will not be affected, also the appearances of the substrates will not be affected and the designing for the substrates can be simplified.

Additionally, when alignment and assembling are processed for substrates of different specifications by machines, existing characters of a surface shape of a particular partial region (e.g. inner edge corners of an outer frame of a display, outer edge corners of a sealant of a liquid crystal panel module, outer edge corners of circuit patterns on a surface of a printed circuit board or wafer, outer edge corners of effective regions of a test paper, etc.) of the substrate can be set and changed as the referenced fiducial marks by the image processing device based on the different specifications of the substrates, so that a flexibility of operational settings for the alignment and assembling of the substrates can be enhanced.

The present invention has been described with preferred embodiments thereof and it is understood that many changes and modifications to the described embodiments can be carried out without departing from the scope and the spirit of the invention that is intended to be limited only by the appended claims.

What is claimed is:

1. An alignment method for assembling substrates without fiducial mark, comprising steps of:
   a step (S01) of pre-capturing at least two regional template images of a template substrate without fiducial mark by at least one first image capturing unit, and pre-defining a template surface shape feature in each of the regional template images and storing character data of shapes of the template surface shape feature before assembling;
   a step (S02) of disposing a to-be-aligned first substrate which is the same as the template substrate without fiducial mark in a alignment-and-assembling space, and capturing at least two regional run-time images of the first substrate when assembling by the same first image capturing unit;

a step (S03) of comparing the regional run-time images of the first substrate with the character data of shapes of the template surface shape features to obtain at least two run-time surface shape features in the regional run-time images matching with the template surface shape features;

a step (S04) of building an actual coordinate system of the first substrate by using center coordinates of the at least two run-time surface shape features;

a step (S05) of comparing the actual coordinate system of the first substrate with a coordinate system of a second substrate without fiducial mark to obtain three types of offset values $\Delta X$, $\Delta Y$, $\Delta \theta$ of the first substrate on the X and Y axial directions and the rotational angle relative to the correct waiting position of the alignment-and-assembling space, wherein at least two regional run-time images of the second substrate is captured by at least one second image capturing unit different from the first image capturing unit, and then center coordinates of a central position of each of the regional run-time images of the second substrate is obtained in order to build the coordinate system of the second substrate;

a step (S06) of using the offset values $\Delta X$, $\Delta Y$, $\Delta \theta$ as movement compensation values of the first substrate to move the first substrate to the correct waiting position in the alignment-and-assembling space if the offset values $\Delta X$, $\Delta Y$, $\Delta \theta$ are larger than a preset value; and determining that the first substrate is at the correct waiting position in the alignment-and-assembling space if the offset values $\Delta X$, $\Delta Y$, $\Delta \theta$ are smaller than the preset value; and a step (S08) of moving the first substrate by a predetermined movement value $\Delta Z$ along the Z axis until the first substrate is aligned with the second substrate in the alignment-and-assembling space to finish alignment and assembling.

2. The alignment method for assembling substrates without fiducial mark as claimed in claim 1, wherein after the step (S06), further comprising:
a step (S07) of processing the steps (S02) to (S06) again to ensure if the first substrate is at the correct waiting position in the alignment-and-assembling space, if yes, then proceeding to the step (S08); if not, then going back to the step (S02).

3. The alignment method for assembling substrates without fiducial mark as claimed in claim 1, wherein the first image capturing unit is CCD or CMOS type.

4. The alignment method for assembling substrates without fiducial mark as claimed in claim 1, wherein the center coordinates of a central position of each of the run-time surface shape features in the step (S04) are obtained by computing with a centroid method in order to build the actual coordinate system of the first substrate.

5. The alignment method for assembling substrates without fiducial mark as claimed in claim 1, wherein in the step (S05), the center coordinates of the central position of each of the regional run-time images of the second substrate is obtained by computing with a centroid method in order to build the coordinate system of the second substrate.

6. The alignment method for assembling substrates without fiducial mark as claimed in claim 1, wherein the second substrate in the alignment-and-assembling space in the step (S06) is disposed below or above the first substrate in the alignment-and-assembling space along the Z axis.

7. The alignment method for assembling substrates without fiducial mark as claimed in claim 1, wherein a tri-axial movement device is used to move the first substrate along the X, Y and $\theta$ axes in the step (S06).

8. The alignment method for assembling substrates without fiducial mark as claimed in claim 7, wherein the tri-axial movement device is used to further move the first substrate along the Z axis.

9. The alignment method for assembling substrates without fiducial mark as claimed in claim 1, wherein the first and the second substrates are selected from: two single layered circuit substrates of a multi-layered printed circuit board, two glass substrates of a liquid crystal panel module, an outer frame of a display and a liquid crystal panel module, a glass photomask and a wafer, a chemical test paper and a protective film.

* * * * *